(12) United States Patent
Chen

(10) Patent No.: US 10,607,983 B2
(45) Date of Patent: *Mar. 31, 2020

(54) TRANSIENT VOLTAGE SUPPRESSOR

(71) Applicant: uPI semiconductor corporation, Zhubei, Hsinchu County (TW)

(72) Inventor: Chih-Hao Chen, Zhubei (TW)

(73) Assignee: UPI SEMICONDUCTOR CORP., Zhubei, Hsinchu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/191,500

(22) Filed: Nov. 15, 2018

(65) Prior Publication Data

US 2019/0165089 A1 May 30, 2019

(30) Foreign Application Priority Data

Nov. 24, 2017 (TW) .............................. 106141033 A

(51) Int. Cl.
H01L 27/02 (2006.01)
H01L 29/06 (2006.01)

(52) U.S. Cl.
CPC ...... H01L 27/0259 (2013.01); H01L 27/0248 (2013.01); H01L 27/0255 (2013.01); H01L 27/0262 (2013.01); H01L 29/0615 (2013.01); H01L 29/0619 (2013.01)

(58) Field of Classification Search
CPC ............. H01L 27/0248; H01L 27/0255; H01L 27/0259; H01L 27/0262; H01L 29/0615; H01L 29/0619
See application file for complete search history.

(56) References Cited

U.S. PATENT DOCUMENTS

| 4,626,882 A * | 12/1986 | Cottrell ................. H01L 21/761 257/357 |
| 6,171,891 B1 * | 1/2001 | Lee .................... H01L 21/82381 257/E21.634 |
| 6,172,404 B1 | 1/2001 | Chen et al. |
| 6,268,639 B1 | 7/2001 | Li et al. |
| 6,268,992 B1 | 7/2001 | Lee et al. |
| 6,696,708 B2 | 2/2004 | Hou et al. |
| 6,759,691 B2 | 7/2004 | Chen |
| 2008/0029782 A1 * | 2/2008 | Carpenter ........... H01L 27/0255 257/173 |
| 2012/0012974 A1 * | 1/2012 | Chuang ............... H01L 27/0255 257/510 |

(Continued)

Primary Examiner — Michael Jung
(74) Attorney, Agent, or Firm — McClure, Qualey & Rodack, LLP

(57) ABSTRACT

A transient voltage suppressor includes a substrate, a first well, a second well, a third well, a first electrode, a second electrode and a doped region. The first well is formed in the substrate and near a surface of the substrate. The second well is formed in the first well and near the surface. The third well is formed in the first well and near the surface. There is a gap between the second well and the third well. The first electrode and second electrode are formed in the second well and near the surface respectively. The first well and first electrode have a first electrical property. The second well, third well and second electrode have a second electrical property. The doped region is formed between the first electrode and second electrode and near the surface and electrically connected with the first well and third well.

13 Claims, 4 Drawing Sheets

(56) References Cited

U.S. PATENT DOCUMENTS

2012/0205714 A1* 8/2012 Salcedo .............. H01L 27/0262
 257/140
2013/0285113 A1* 10/2013 Edwards ............ H01L 27/0262
 257/133
2017/0288058 A1* 10/2017 Appaswamy ....... H01L 29/7835

* cited by examiner

TRANSIENT VOLTAGE SUPPRESSOR

BACKGROUND OF THE INVENTION

1. Field of the Invention

The invention relates to transient voltage; in particular, to a transient voltage suppressor (TVS).

2. Description of the Prior Art

In general, electrostatic discharge is one of the important factors affecting the yield and reliability of electronic products. Especially, because there are a lot of hot-swap interfaces in recent electronic products and the changes in consumer behavior, the risk of electrostatic discharge causing damage to electronic products becomes higher. Therefore, many manufacturers have raised the electrostatic discharge test specifications to the highest level. Among the many electrostatic protector products, the transient voltage suppressor array (TVS array) has the advantages of fast conduction speed and low clamping voltage, and has become the best choice for meeting the highest level of electrostatic discharge test specifications.

Please refer to FIG. 1. FIG. 1 illustrates a diagram showing current-voltage characteristic curves of a conventional transient voltage suppressor. As shown in FIG. 1, when the forward voltage +V is small, the transient voltage suppressor exhibits a high resistance characteristic and is in an OFF state; when the forward voltage +V reaches a breakdown voltage VBR, the transient voltage suppressor will be turned on and in an ON state, and its resistance will become smaller. This phenomenon of pulling the voltage from the OFF state to the ON state is called "Snap back", and the magnitude of the turn-on voltage VON is usually determined by the amount of current received by the gate.

However, the structure of the conventional transient voltage suppressor is complicated, and the gate structure is required to control the turn-on voltage VON. In addition, when an electrostatic discharge event occurs, the current in the conventional transient voltage suppressor is concentrated in the same current path causing the overall resistance of the transient voltage suppressor to be difficult to reduce.

SUMMARY OF THE INVENTION

Therefore, the invention provides a transient voltage suppressor (TVS) to solve the above-mentioned problems.

A preferred embodiment of the invention is a transient voltage suppressor. In this embodiment, the transient voltage suppressor includes a substrate, a first well, a second well, a third well, a first electrode, a second electrode and a doped region. The substrate has a surface. The first well is formed in the substrate and near the surface of the substrate. The first well has a first electrical property. The second well is formed in the first well and near the surface of the substrate. The second well has a second electrical property. The third well is formed in the first well and near the surface of the substrate. The third well has the second electrical property. There is a gap between the second well and the third well. The second well and the third well are diffused to connect each other on the gap. The first electrode is formed in the second well and near the surface of the substrate. The first electrode has the first electrical property. The second electrode is formed in the first well and near the surface of the substrate. The second electrode has the second electrical property. The doped region is formed between the first electrode and the second electrode and near the surface of the substrate. The doped region is electrically connected with the first well and the third well respectively.

In an embodiment, the transient voltage suppressor further includes a fourth well, a third electrode and a fourth electrode. The fourth well is formed in the substrate out of the first well and near the surface of the substrate. The third electrode is formed in the fourth well and near the surface of the substrate and the third electrode has the first electrical property. The fourth electrode is formed in the fourth well and near the surface of the substrate and the fourth electrode has the second electrical property. The third electrode is electrically connected with an input/output terminal and the fourth electrode is electrically connected with the first electrode.

In an embodiment, the transient voltage suppressor further includes a heavily-doped region. The heavily-doped region is formed under the doped region. The heavily-doped region and the doped region both have the same electrical property and the doping concentration of the heavily-doped region is higher than the doping concentration of the doped region.

In an embodiment, the heavily-doped region and the doped region both have the first electrical property.

In an embodiment, the heavily-doped region and the doped region both have the second electrical property.

In an embodiment, the doped region is disposed on an edge of the third well and adjacent to the first well.

In an embodiment, the first electrode and the second electrode are electrically connected with an anode and a cathode respectively.

In an embodiment, the doped region is floating.

In an embodiment, the third well and the second well are divided by the first well to form the gap between the third well and the second well; the second well and the third well are diffused to connect each other to be conducted through a drive-in process to form the diffusion-connected second well and third well, so that a first current path formed from the first electrode, the diffusion-connected second well and third well, the heavily-doped region, the first well to the second electrode is conducted.

In an embodiment, when an electrostatic discharge (ESD) event occurs, not only a first current path formed from the first electrode, the diffusion-connected second well and third well, the heavily-doped region, the first well to the second electrode is conducted, but also a second current path formed from the first electrode, the second well, the first well to the second electrode is also conducted to reduce an overall resistance of the transient voltage suppressor.

In an embodiment, the diffusion-connected second well and third well forms a gourd-like well.

In an embodiment, a trigger voltage of the transient voltage suppressor is related to a doping concentration of the heavily-doped region.

In an embodiment, an on-resistance of the transient voltage suppressor is related to a size of the gap, a doping concentration of the second well and a doping concentration of the third well.

In an embodiment, a doping concentration of the doped region is higher than doping concentrations of the first well, the second well and the third well.

Compared to the prior art, the transient voltage suppressor of the invention has the following advantages and effects:

(1) Since the transient voltage suppressor includes only the anode and the cathode and it is not coupled to the gate electrode, the structure of the transient voltage suppressor is relatively simple;

(2) There is a gap between the second well where the first electrode is disposed and the third well where the doped region is disposed, and the second well and the third well are diffused in the gap to connect each other to form a gourd-like well to increase the resistance of the first current path, so that the majority of the current flows along the second current path to prevent the doped region from being burnt due to large current. In addition, the on-resistance of the transient voltage suppressor is related to the size of the gap, the doping concentration of the second well and the doping concentration of the third well, so that the on-resistance of the transient voltage suppressor can be regulated by changing the size of the gap or the doping concentrations of the second well and the third well; and (3) A floating doped region is disposed between the anode and the cathode of the transient voltage suppressor and a heavily-doped region is disposed under the doped region as a trigger structure, so that the breakdown voltage can be reduced by adjusting the doping concentration of the heavily-doped region. When an electrostatic discharge event occurs, the first current path formed from the first electrode, the diffusion-connected second well and third well, the heavily-doped region, the first well to the second electrode will be conducted, so that the trigger voltage can be reduced by adjusting the doping concentration of the heavily-doped region, at the same time, the second current path formed from the first electrode, the second well, the first well to the second electrode will be also conducted to effectively reduce the overall resistance of the transient voltage suppressor in a current shunting way, so that the majority of the current will flow along the second current path to prevent the doped region from being burnt due to large current.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
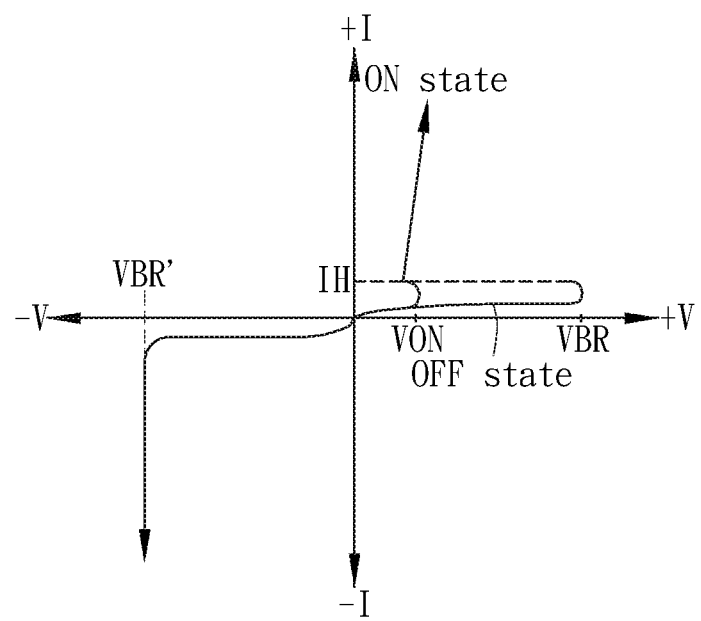
FIG. 1 illustrates a diagram showing current-voltage characteristic curves of a conventional transient voltage suppressor.

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts.

A preferred embodiment of the present invention is a transient voltage suppressor. In this embodiment, the transient voltage suppressor is used to provide a protection function when an electrostatic discharge event occurs to ensure that the electronic component to be protected is not damaged by the electrostatic discharge, but is not limited thereto.

Figure 2:
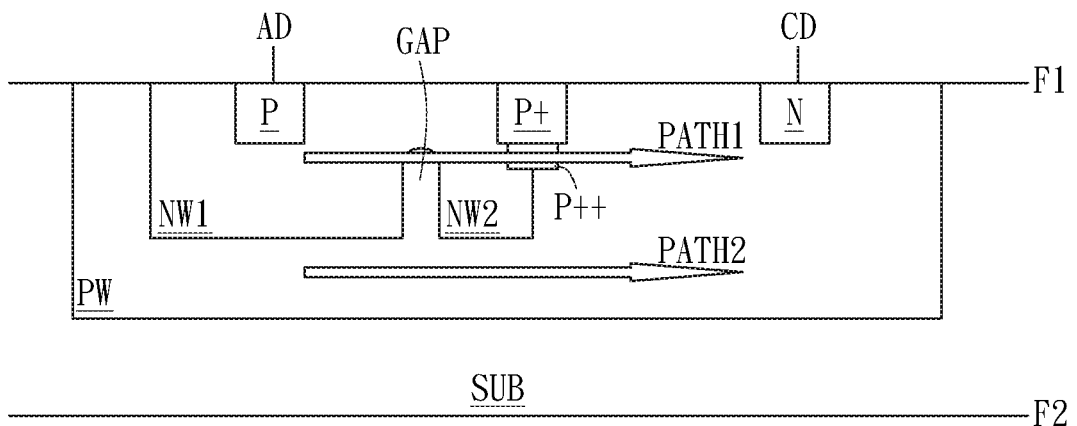
FIG. 2 illustrates a cross-sectional diagram of the transient voltage suppressor and the current shunting through the first current path and the second current path when an electrostatic discharge event occurs in a preferred embodiment of the invention.

Please refer to FIG. 2. FIG. 2 illustrates a cross-sectional diagram of the transient voltage suppressor and the current shunting through the first current path and the second current path when an electrostatic discharge event occurs in a preferred embodiment of the invention.

As shown in FIG. 2, the transient voltage suppressor 2 includes a substrate SUB, a first well PW, a second well NW1, a third well NW2, a first electrode P, a second electrode N, a doped region P+, and a heavily-doped region P++.

The substrate SUB has a first surface F1 and a second surface F2 opposite to each other. The first well PW is formed in the substrate SUB and adjacent to the first surface F1. The second well NW1 is formed in the first well PW and adjacent to the first surface F1. The third well NW2 is formed in the first well PW and adjacent to the first surface F1. There is a gap between the second well NW1 and the third well NW2. The first well PW has a first electrical property and the second well NW1 has a second electrical property.

The first electrode P is formed in the second well NW1 and adjacent to the first surface F1. The second electrode N is formed in the first well PW and adjacent to the first surface F1. The first electrode P has the first electrical property and the second electrode N has the second electrical property. The first electrode P and the second electrode N are electrically connected to the anode AD and the cathode CD respectively.

In this embodiment, assuming that the first electrical property is P-type and the second electrical property is N-type, then the electrical property of the first well PW is P-type and the electrical property of the second well NW1 and the third well NW2 is N-type; the electrical property of the first electrode P is P-type and the electrical property of the second electrode N is N-type.

The doped region P+ is formed between the first electrode P and the second electrode N and adjacent to the first surface F1. The doped region P+ is electrically connected to the first well PW and the third well NW2 respectively. The heavily-doped region P++ is formed under the doped region P+. The doped region P+ is floating and is located at the edge of the third well NW2 and adjacent to the first well PW.

It should be noted that the heavily-doped region P++ of the invention has the same electrical property as the doped region P+ and the doping concentration of the heavily-doped region P++ is higher than the doping concentration of the doped region P+. In this embodiment, the electrical properties of the heavily-doped region P++ and the doped region P+ are both P-type, but not limited to this.

Except that the doping concentration of the heavily-doped region P++ is higher than the doping concentration of the doped region P+, the doping concentration of the doped region P+ is higher than the doping concentration of the first well PW, the second well NW1 and the third well NW2. That is to say, the order of the doping concentration from high to low is: the doping concentration of the heavily-doped region P++>the doping concentration of the doped region P+>the doping concentrations of the first well PW, the second well NW1 and the third well NW2.

The second well NW1 and the third well NW2 are diffused to connect each other to form a gourd-like well to increase the resistance of the first current path to prevent the doped region P+ from being burnt due to large current.

It should be noticed that an on-resistance of the transient voltage suppressor 2 can be related to a size of the gap GAP, a doping concentration of the second well NW1 and a doping concentration of the third well NW2; therefore, the invention can regulate the on-resistance of the transient voltage suppressor 2 by changing the size of the gap GAP and the doping concentration of the second well NW1 and the third well NW2, but not limited to this.

When the transient voltage suppressor 2 operates normally, since the PN junctions formed between the N-type gourd-like well (formed by the diffusion-connected second well NW1 and third well NW2) and the heavily-doped region P++ and between the N-type gourd-like well and the doped region P+ in the transient voltage suppressor 2 have a reverse bias, the current path from the anode AD to the cathode CD is not conducted. When an electrostatic discharge event occurs, the PN junctions formed between the N-type gourd-like well and the heavily-doped region P++ and between the N-type gourd-like well and the doped region P+ breakdown, the transient voltage suppressor 2 will immediately activate its electrostatic protection mechanism, so that a first current path PATH1 formed from the first electrode P, the N-type gourd-like well (formed by the diffusion-connected second well NW1 and third well NW2), the heavily-doped region P++, the first well PW to the second electrode N is conducted; in addition, a second current path PATH2 formed from the first electrode P, the second well NW1, the first well PW to the second electrode N is also conducted, so that the current flowing from the anode AD can flow not only along the original first current path PATH1, but also along the second current path PATH2 to flow through the first electrode P, the N-type gourd-like well, the first well PW, the second electrode N to the cathode CD.

In practical applications, since the current will flow through the heavily-doped region P++ having the highest doping concentration, the trigger voltage of the transient voltage suppressor 2 is related to the doping concentration of the heavily-doped region P++. Therefore, the invention can also regulate the trigger voltage of the transient voltage suppressor 2 by changing the doping concentration of the heavily-doped region P++, but is not limited to this. Thereby, the invention can prevent the current from being excessively concentrated on the same current path in a current shunting way, so as to effectively reduce the overall resistance of the transient voltage suppressor 2.

Figure 3:
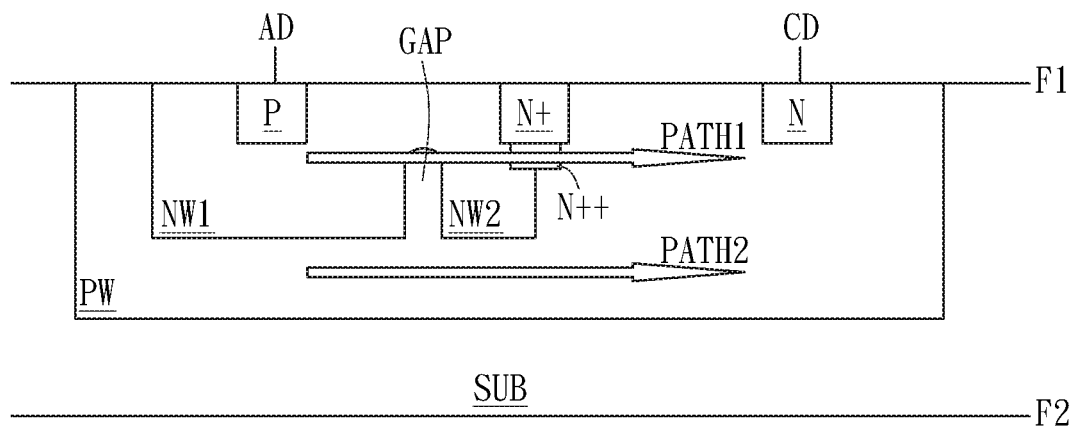
FIG. 3 illustrates a cross-sectional diagram of the transient voltage suppressor and the current shunting through the first current path and the second current path when an electrostatic discharge event occurs in another preferred embodiment of the invention.

Next, please refer to FIG. 3. FIG. 3 illustrates a cross-sectional diagram of the transient voltage suppressor and the current shunting through the first current path and the second current path when an electrostatic discharge event occurs in another preferred embodiment of the invention.

The difference between the transient voltage suppressor 3 shown in FIG. 3 and the transient voltage suppressor 2 shown in FIG. 2 is that the electrical properties of the heavily-doped region N++ and the doped region N+ in the transient voltage suppressor 3 are both N-type.

As shown in FIG. 3, the second well NW1 and the third well NW2 in the transient voltage suppressor 3 are diffused to connect each other to form a gourd-like well to increase the resistance of the first current path to prevent the doped region P+ from being burnt due to large current.

When the transient voltage suppressor 3 is powered on, the PN junctions formed between the doped region N+ and the first well PW and between the heavily-doped region N++ and the first well PW have a reverse bias, the current path from the anode AD to the cathode CD is not conducted.

In practical applications, since the current will flow through the heavily-doped region N++ having the highest doping concentration, the trigger voltage of the transient voltage suppressor 3 is related to the doping concentration of the heavily-doped region N++. Therefore, the invention can also regulate the trigger voltage of the transient voltage suppressor 3 by changing the doping concentration of the heavily-doped region N++, but is not limited to this.

When an electrostatic discharge event occurs, the PN junctions formed between the doped region N+ and the first well PW and between the heavily-doped region N++ and the first well PW breakdown, the transient voltage suppressor 3 will immediately activate its electrostatic protection mechanism, not only the first current path PATH1 formed from the first electrode P, the N-type gourd-like well formed by the diffusion-connected second well NW1 and third well NW2, the heavily-doped region N++, the first well PW to the second electrode N is conducted, but also the second current path PATH2 formed from the first electrode P, the second well NW1, the first well PW to the second electrode N is also conducted, so that the current flowing from the anode AD can flow not only along the original first current path PATH1, but also along the second current path PATH2 to flow through the first electrode P, the second well NW1, the first well PW, the second electrode N to the cathode CD. Thereby, the invention can prevent the current from being excessively concentrated on the same current path in current shunting way, so as to effectively reduce the overall resistance of the transient voltage suppressor 4.

In another embodiment, the transient voltage suppressor can further include other components, such as at least one bypass diode, to achieve bidirectional protection effect, but not limited to this.

Figure 4A:
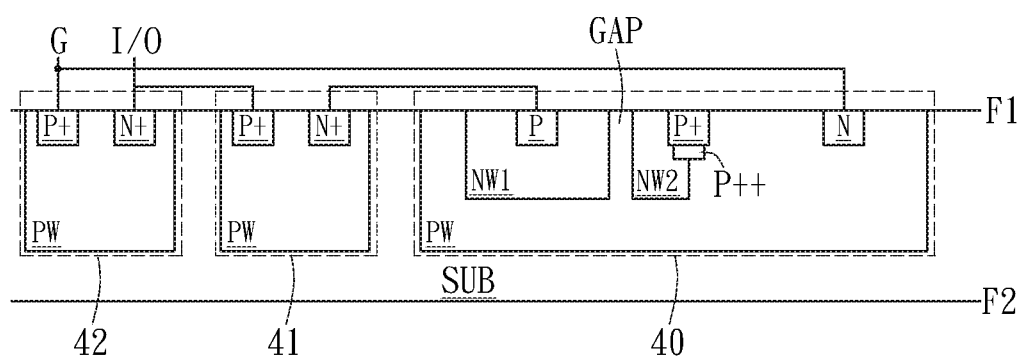
FIG. 4A and FIG. 4B illustrate a cross-sectional diagram and a circuit diagram of the transient voltage suppressor including bypass diodes respectively.
Figure 4B:
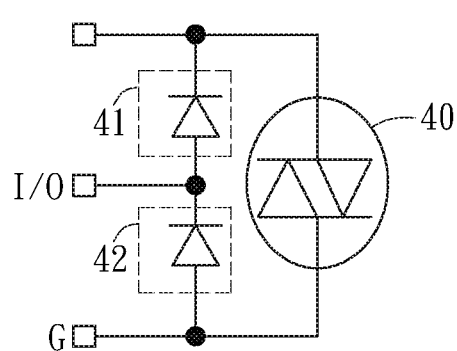

Please refer to FIG. 4A and FIG. 4B. FIG. 4A and FIG. 4B illustrate a schematic cross-sectional diagram and a circuit diagram of the transient voltage suppressor 4 further including the bypass diodes 41~42. As shown in FIG. 4A and FIG. 4B, the transient voltage suppressor 4 includes the same transient voltage suppressor 40 as the transient voltage suppressor 2 of FIG. 2, and the transient voltage suppressor 4 further includes bypass diodes 41~42. The bypass diodes 4142 are coupled in series with each other and then coupled in parallel with the transient voltage suppressor 40. Since the transient voltage suppressor 40 is the same as the transient voltage suppressor 2 of FIG. 2, the structure of the transient voltage suppressor 40 can be referred as above, and will not be further described herein.

In this embodiment, the bypass diode 41 includes a fourth well PW, a third electrode P+ and a fourth electrode N+. The fourth well PW is formed in the substrate SUB out of the first well PW and adjacent to the first surface F1. The third electrode P+ is formed in the fourth well PW and adjacent to the first surface F1. The fourth electrode N+ is formed in the fourth well PW and adjacent to the first surface F1. The third electrode P+ has the first electrical property and the fourth electrode N+ has the second electrical property. The third electrode P+ is electrically connected to the input/output terminal I/O. The fourth electrode N+ is electrically connected to the first electrode P.

Similarly, the bypass diode 42 includes a fifth well PW, a fifth electrode P+ and a sixth electrode N+. The fifth well PW is formed in the substrate SUB out of the first well PW and the fourth well PW and adjacent to the first surface F1. The fifth electrode P+ is formed in the fifth well PW and adjacent to the first surface F1. The sixth electrode N+ is formed in the fifth well PW and adjacent to the first surface F1. The fifth electrode P+ has the first electrical property and the sixth electrode N+ has the second electrical property. The fifth electrode P+ is electrically connected to the second electrode N and the gate electrode G. The sixth electrode N+ is electrically connected to the input/output terminal I/O.

Compared to the prior art, the transient voltage suppressor of the invention has the following advantages and effects:

(1) Since the transient voltage suppressor includes only the anode and the cathode and it is not coupled to the gate electrode, the structure of the transient voltage suppressor is relatively simple;

(2) There is a gap between the second well where the first electrode is disposed and the third well where the doped region is disposed, and the second well and the third well are diffused in the gap to connect each other to form a gourd-like well to increase the resistance of the first current path, so that the majority of the current flows along the second current path to prevent the doped region from being burnt due to large current. In addition, the on-resistance of the transient voltage suppressor is related to the size of the gap, the doping concentration of the second well and the doping concentration of the third well, so that the on-resistance of the transient voltage suppressor can be regulated by changing the size of the gap or the doping concentrations of the second well and the third well; and (3) A floating doped region is disposed between the anode and the cathode of the transient voltage suppressor and a heavily-doped region is disposed under the doped region as a trigger structure, so that the breakdown voltage can be reduced by adjusting the doping concentration of the heavily-doped region. When an electrostatic discharge event occurs, the first current path formed from the first electrode, the diffusion-connected second well and third well, the heavily-doped region, the first well to the second electrode will be conducted, so that the trigger voltage can be reduced by adjusting the doping concentration of the heavily-doped region, at the same time, the second current path formed from the first electrode, the second well, the first well to the second electrode will be also conducted to effectively reduce the overall resistance of the transient voltage suppressor in a current shunting way, so that the majority of the current will flow along the second current path to prevent the doped region from being burnt due to large current.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A transient voltage suppressor, comprising:
    a substrate having a surface;
    a first well, formed in the substrate and near the surface of the substrate, having a first electrical property;
    a second well, formed in the first well and near the surface of the substrate, having a second electrical property;
    a third well, formed in the first well and near the surface of the substrate, having the second electrical property;
    a first electrode, formed in the second well and near the surface of the substrate, having the first electrical property;
    a second electrode, formed in the first well and near the surface of the substrate, having the second electrical property;
    a doped region, formed between the first electrode and the second electrode and near the surface of the substrate, electrically connected with the first well and the third well;
    a fourth well, formed in the substrate and near the surface of the substrate, being outside the first well;
    a third electrode, formed in the fourth well and near the surface of the substrate, having the first electrical property; and
    a fourth electrode, formed in the fourth well and near the surface of the substrate, having the second electrical property,
    wherein there is a gap between the second well and the third well, and the second well and the third well are diffused to connect each other to be conducted in the gap; the third electrode is electrically connected with an input/output terminal, and the fourth electrode is electrically connected with the first electrode.

2. The transient voltage suppressor of claim 1, further comprising:
    a heavily-doped region, formed under the doped region, having the same electrical property with the doped region and having a doping concentration higher than that of the doped region.

3. The transient voltage suppressor of claim 2, wherein the heavily-doped region and the doped region both have the first electrical property.

4. The transient voltage suppressor of claim 2, wherein the heavily-doped region and the doped region both have the second electrical property.

5. The transient voltage suppressor of claim 2, wherein the third well and the second well are divided by the first well to form the gap between the third well and the second well; the second well and the third well are diffused to connect each other to be conducted through a drive-in process to form the diffusion-connected second well and third well, so that a first current path formed from the first electrode, the diffusion-connected second well and third well, the heavily-doped region, the first well to the second electrode is conducted.

6. The transient voltage suppressor of claim 2, wherein when an electrostatic discharge (ESD) event occurs, not only a first current path formed from the first electrode, the diffusion-connected second well and third well, the heavily-doped region, the first well to the second electrode is conducted, but also a second current path formed from the first electrode, the second well, the first well to the second electrode is also conducted to reduce an overall resistance of the transient voltage suppressor.

7. The transient voltage suppressor of claim 2, wherein a trigger voltage of the transient voltage suppressor is related to a doping concentration of the heavily-doped region.

8. The transient voltage suppressor of claim 1, wherein the doped region is located on an edge of the third well and adjacent to the first well.

9. The transient voltage suppressor of claim 1, wherein the first electrode and the second electrode are electrically connected with an anode and a cathode respectively.

10. The transient voltage suppressor of claim 1, wherein the doped region is floating.

11. The transient voltage suppressor of claim 1, wherein the diffusion-connected second well and third well forms a gourd-like well.

12. The transient voltage suppressor of claim 1, wherein an on-resistance of the transient voltage suppressor is related to a size of the gap, a doping concentration of the second well and a doping concentration of the third well.

13. The transient voltage suppressor of claim 1, wherein a doping concentration of the doped region is higher than doping concentrations of the first well, the second well and the third well.

\* \* \* \* \*